US007502698B2

(12) United States Patent
Uenou et al.

(10) Patent No.: US 7,502,698 B2
(45) Date of Patent: Mar. 10, 2009

(54) POWER CONSUMPTION MEASURING DEVICE AND POWER CONTROL SYSTEM

(75) Inventors: Yasuhiro Uenou, Tokyo (JP); Tetsuya Yano, Tokyo (JP)

(73) Assignee: IP Power Systems Corporation, Tokyo (JP)

( * ) Notice: Subject to any disclaimer, the term of this patent is extended or adjusted under 35 U.S.C. 154(b) by 176 days.

(21) Appl. No.: 11/630,696

(22) PCT Filed: Jul. 5, 2005

(86) PCT No.: PCT/JP2005/012399

§ 371 (c)(1),
(2), (4) Date: Dec. 27, 2006

(87) PCT Pub. No.: WO2006/004112

PCT Pub. Date: Jan. 12, 2006

(65) Prior Publication Data

US 2007/0241739 A1    Oct. 18, 2007

(51) Int. Cl.
*G01R 21/00* (2006.01)
(52) U.S. Cl. .................. 702/60; 702/187; 324/141; 324/142
(58) Field of Classification Search ............. 702/60–62, 702/64, 187, 188; 324/141, 142; 340/870.01, 340/870.02, 3.1, 3.3, 3.31, 3.32, 3.9
See application file for complete search history.

(56) References Cited

FOREIGN PATENT DOCUMENTS

| JP | U 3022947 | 1/1996 |
|---|---|---|
| JP | B2 2788910 | 6/1998 |
| JP | U 3067582 | 1/2000 |
| JP | B2 3088958 | 7/2000 |
| JP | B2 3092618 | 7/2000 |
| JP | A 2000-251181 | 9/2000 |
| JP | A 2000-286757 | 10/2000 |
| JP | A 2001-028093 | 1/2001 |
| JP | B2 3159307 | 2/2001 |
| JP | B2 3160532 | 2/2001 |
| JP | A 2001-083182 | 3/2001 |
| JP | B2 3202005 | 6/2001 |
| JP | A 2001-264356 | 9/2001 |
| JP | A 2001-266277 | 9/2001 |
| JP | A 2001-344411 | 12/2001 |
| JP | A 2002-116923 | 4/2002 |
| JP | B2 3323469 | 6/2002 |

(Continued)

*Primary Examiner*—Manuel L Barbee
(74) *Attorney, Agent, or Firm*—Oliff & Berridge, PLC

(57) ABSTRACT

A single-phase, 3-wire watthour meter which can measure power consumption, alter a contract capacity, control the stop/start of power supply/distribution, and easily update programs from a higher-level control apparatus by providing a central processing unit, a storing means, a communicating means and various interfaces, can measure, for example, every 0.2 sec, a currents (ia and ib) running through 100V T-phase and R-phase, voltages (v1 and v2) between T-N and between R-N and a current (i3) and a voltage (v3) under a 200V load, determine a 100V power consumption by $W100=(ia-i3)\cdot v1+(ib-i3)\cdot v2$ and a 200V power consumption by $W200=i3\cdot v3$, and measure the detailed behavior of a power consumption by totaling a power consumption every 30 min, interlocks with a gas leakage detector and a fire alarm, can control the opening/closing of rain doors and shutters and the operation/stop of Internet home electric appliances, and enables low-cost communication by means of dynamic IP Address-based communication.

13 Claims, 10 Drawing Sheets

FOREIGN PATENT DOCUMENTS

| | | |
|---|---|---|
| JP | B2 3329335 | 7/2002 |
| JP | B2 3339495 | 8/2002 |
| JP | A 2003-044691 | 2/2003 |
| JP | B2 3447622 | 7/2003 |
| JP | 2003222645 A * | 8/2003 |
| JP | A 2003-222645 | 8/2003 |
| JP | A 2003-242582 | 8/2003 |
| JP | A 2003-259463 | 9/2003 |
| JP | A 2004-4084 | 1/2004 |
| JP | B2 3538154 | 3/2004 |
| JP | A 2004-233239 | 8/2004 |
| JP | A 2005-164561 | 6/2005 |

* cited by examiner

Left side view    Right side view

POWER CONSUMPTION MEASURING DEVICE AND POWER CONTROL SYSTEM

TECHNICAL FIELD

The present invention relates to a power consumption measuring device which is installed on the consumer's side of a private power distribution system and measures individual power consumption constituting grounds for billing and a power control system.

BACKGROUND ART

A typical household, which is supplied with electrical power via a single-phase three-wire system, can utilize both 100V (hereinafter referred to as "a base voltage") and 200V (hereinafter referred to as "a double-high voltage"). Although "the base voltage" is said to be 100V and "the double-high voltage" to be 200V, these values are listed by way of example only and are not intended to limit the values applicable to the present invention. The base voltage and the double-high voltage may, for example, be 200V and 400V, respectively.

(Multiple Measurements of Power Consumption)

If a single watthour meter can measure consumer's power consumption for both the base voltage and the double-high voltage, then the area and space required for the installation of the watthour meter can be reduced, compared to the case where two watthour meters are installed individually. Accordingly, areas and spaces of the building can be effectively utilized. Existing inventions are as follows.

Patent Document 7 (Japanese Patent No. 3159307) describes an invention that monitors the power consumption of each terminal load and uses a LAN as the network connection.

Patent Document 8 (Japanese Patent No. 3329335) describes an invention that measures electrical power through a plurality of current and voltage inputs. Although the network connection is used to switch multiple circuits for making measurements, simultaneous measurements cannot be performed.

Patent Document 9 (Japanese Patent No. 3092618), Patent Document 10 (Japanese Patent No. 3323469), Patent Document 11 (Japanese Patent No. 3160532), and the like describe inventions that make a plurality of electrical power measurements with a single watthour meter. However, they are not capable of measuring power consumption for both the base voltage and the double-high voltage with a single watthour meter. On the other hand, inventions described in Patent Document 24 (Japanese Patent No. 3339495), Patent Document 25 (Japanese Patent Laid-Open Publication No. 2003-222645), and the like are partly capable of measuring the power consumption of a plurality of load circuits with a single watthour meter. However, they are not capable of being interconnected with home security systems or home information appliances or of breaking power supply during peak hours of power consumption.

(Remote Meter Reading)

Meter reading from a remote location, instead of having a meter reader visit households individually to measure power consumption, and the like has been desired for some time in order to save labor costs or to ensure the accuracy of the meter reading, and many inventions already exist in relation thereto. Patent Document 1 (Japanese Patent Laid-Open Publication No. 2001-266277) describes an invention regarding a remote metering method and a system thereof utilizing PHS (Personal Handyphone System) and a CATV (Cable TV) network. Patent Document 2 (Japanese Patent Laid-Open Publication No. 2003-242582) describes a remote meter reading device for reading watthours characterized by being equipped with interfaces for both analog and digital circuits. Patent Document 3 (Japanese Patent Laid-Open Publication No. 2000-286757) describes an invention regarding a communication device for power line transmission as the communication line in an automatic meter reading system.

(Hour-Specific Rate)

Patent Document 4 (Japanese Patent Laid-Open Publication No. 2004-233239) describes a watthour meter which, in addition to the remote meter reading capability, can take into consideration the time variation of power consumption, thereby calculating electricity charges for different times of the day, such as day-time hours and late night hours with a single watthour meter. However, none of the four inventions is capable of making meter readings of power consumption for both the base voltage and the double-high voltage simultaneously with a single watthour meter, nor would they be capable of alternately displaying power consumption for the base voltage and the double-high voltage. Moreover, even when signals from the watthour meter were not transmitted to a higher-level system for some reason, the higher-level system could not transmit a signal request signal to the watthour meter.

(Stop and Start by Remote Control)

When power supply is to be stopped for reasons attributable to the consumer, such as non-payment of electricity charges, moving from the current address, and the like, conventional practice is that a worker visits the consumer's place and perform the dismantling of the power line. However, since work undertaken by such a worker incurs labor costs, it would be preferable that such work be conducted remotely, thereby saving on expenses. In Patent Document 5 (Japanese Patent No. 3088958), both a stop and start of a power supply can be undertaken by radio from a remote location, and, in addition to this, the condition of the power supply can be confirmed. Patent Document 6 (Japanese Patent No. 3202005) describes an invention relating to a method of connecting meter reading terminals and the main computer via RS485 communication line, PHS, and the like. In the invention, the main computer installed at the center automatically makes meter readings on a plurality of watthour meters and maintains remote control over the meters while determining whether to turn the line on or off during peak hours according to the level of importance. However, specific technologies for determining the priorities for such turning on and turning off are not disclosed.

However, these conventional technologies do not make it possible for the consumer power consumption to be measured for both the base voltage and the double-high voltage separately using a single watthour meter. Moreover, these conventional technologies are not capable of stopping or restricting the supply of power when power consumption within a certain period of time exceeds a predetermined value, thereby prompting the consumer to use electricity designedly, nor are they capable of stopping the supply of power when power consumption instantaneously exceeds a prescribed value because of safety-related events such as electrical leakage or a short circuit. Furthermore, these conventional technologies are not capable of altering the contract capacity of the consumer.

(Short Time Values)

In Patent Document 12 (Japanese Patent Laid-Open Publication No. 2001-83182), although not only cumulative values but also short time span values of power consumption can be measured, remote measurements of consumer power consumption cannot be performed, nor can separate measurements be made of power consumption for both the base voltage and the double-high voltage with a single watthour meter.

(Internet-Connected Home Electrical Appliances)

There are a number of inventions regarding Internet-connected home electrical appliances. Patent Document 13 (Japanese Patent Laid-Open Publication No. 2003-44691) describes an invention for rewriting built-in programs via a network and collecting the rewrite fee, Patent Document 14 (Japanese Patent Laid-Open Publication No. 2003-259463) describes an invention for providing correspondence between control commands of Internet-connected home electrical appliances having different interfaces, and Patent Document 15 (Japanese Patent Laid-Open Publication No. 2002-116923) describes an invention for gathering and analyzing information about problems and user complaints associated with Internet-connected home electrical appliances. However, none of these inventions regarding Internet-connected home electrical appliances includes provision for watthour meters.

(Interlock with Home Security Systems)

There are a number of inventions regarding home security systems. For example, Patent Document 16 (Japanese Patent Laid-Open Publication No. 2000-251181) describes an invention for externally controlling a PC controlled home security system via a cell phone, Patent Document 17 (Japanese Patent Laid-Open Publication No. 2001-344411) describes an invention that distributes dynamic images via optical fiber cables, and Patent Document 18 (Japanese Patent No. 2788910) describes an invention regarding a home security system for a housing complex, comprising sensors, monitors and terminals. However, none of these inventions include the capability for including watthour meters in their systems.

(Remote, Hour-Specific, and Perusal from Remote Locations)

There is a further invention that is based on inventions described in Patent Documents 1 through 18 with their usefulness being more enhanced. In Patent Document 19 (Japanese Patent Laid-Open Publication No. 2005-164561), a number of the aforementioned issues were resolved, where power consumption could be measured from remote locations, hour-specific charges were set, and power consumption could be perused via the Internet. However, there was no information storing means for memorizing and storing power consumption in the case where a communication infrastructure failed somewhere because of a disaster or an accident. Furthermore, both the base voltage and the double-high voltage could not be measured with a single watthour meter, and the transmission of information from a watthour meter to higher-level control means was in response to a request from the higher-level control means only and would not be transmitted voluntarily.

(Internet Connection)

In Patent Document 20 (Japanese Patent No. 3538154), consumption of electrical power, and the like was measured or referenced via the Internet. However, in the invention, the watthour meter is assigned with a fixed network address. This means that the address is not dynamically changed each time the connection is made, which increases the expenses of the system.

(Reception of Programs from a Higher-Level Means)

In Patent Document 21 (Japanese Patent No. 3447622) describes a watthour meter with a built-in server computer that receives an agent program, and the agent program collects data on electrical power and forwards it to a data counting center. However, the agent program is received to run every time measurements of power consumption are made and is not memory-resident to allow it to run all the time.

In Patent Document 22 (Japanese Patent Laid-Open Publication No. 2004-4084), which is a divisional application of Japanese Patent No. 3447622, it is made possible that client machines connected to peripherals including monitoring cameras via an information network to control and check operational conditions of those peripherals.

(Calculating Electricity Charges with a Higher-Level Control Means)

In Patent Document 23 (Japanese Patent Laid-Open Publication No. 2004-233239), hour-specific power consumption is measured and the results are transmitted to a processing device installed at a control center, so that hour-specific rates can be established. However, there is no means for storing data for a long period of time in between. Power supply will not be broken, either, when power consumption exceeds a set value.

(On/Off Remote Control)

In Patent Document 24 (Japanese Patent No. 3202005) describes an invention where the main computer installed at the center automatically makes meter readings on a plurality of watthour meters and keeps remote control over them while determining whether to turn the line on or off according to the level of importance during peak hours. However, specific technologies of determining priorities for such turning on and turning off are not disclosed.

(Remote Meter Reading)

Patent Document 1: Japanese Patent Laid-Open Publication No. 2001-266277 "Method for Remote Meter reading and System Thereof"

Patent Document 2: Japanese Patent Laid-Open Publication No. 2003-242582 "Remote Meter reading Device for Watthours"

Patent Document 3: Japanese Patent Laid-Open Publication No. 2000-286757 "Communication Device for Power Line Transmission for an Automatic Meter reading System, Communication System for Power Line Transmission, and Automatic Meter reading System" (Hour-specific Rate)

Patent Document 4: Japanese Patent Laid-Open Publication No. 2004-233239 "Method for Remote Meter reading of Electrical power and System Thereof" (Stop and Start by Remote Control)

Patent Document 5: Japanese Patent No. 3088958 "Method for Managing Power Supply to Electricity Consumers by Remote Control"

Patent Document 6: Japanese Patent No. 3202005 "Automatic Meter reading System for Electrical power" (Multiple Measurements of Power consumption)

Patent Document 7: Japanese Patent No. 3159307 "System for Monitoring Electrical power at Terminal Load"

Patent Document 8: Japanese Patent No. 3329335 "Multi-Circuit Type Watthour Meter, Multi-Circuit Type Watthour Meter, Multi-Circuit Type Power-Factor Meter, Multi-Circuit Type VAR Hour Meter, and Multi-Circuit Type VAR Hour Meter"

Patent Document 9: Japanese Patent No. 3092618 "Multi-Circuit Type Watthour Meter, Multi-Circuit Type Watthour Meter, Multi-Circuit Type Power-Factor Meter, Multi-Circuit Type VAR Hour Meter, Multi-Circuit Type VAR Hour Meter, and Multi-Circuit Type Measuring Instrument"

Patent Document 10: Japanese Patent No. 3323469 "Multi-Circuit Type Watthour Meter"

Patent Document 11: Japanese Patent No. 3160532 "Multi-Circuit Type Watthour Meter" (Short Time Values)

Patent Document 12: Japanese Patent Laid-Open Publication No. 2001-83182 "Induction Type Watthour Meter with Averaged Watthour Measuring Capability" (Internet-connected Home Electrical appliances)

Patent Document 13: Japanese Patent Laid-Open Publication No. 2003-44691 "Management System for Built-in Programs of Home Electrical appliances"

Patent Document 14: Japanese Patent Laid-Open Publication No. 2003-259463 "Home Information Appliances Control Device"

Patent Document 15: Japanese Patent Laid-Open Publication No. 2002-116923 "Method for Diagnosing Troubles of Home Electrical appliances Utilizing the Internet, and Home Electrical appliances Used Therefor" (Watthour Meters Being Interlocked with Home Security System)

Patent Document 16: Japanese Patent Laid-Open Publication No. 2000-251181 "Home Security System"

Patent Document 17: Japanese Patent Laid-Open Publication No. 2001-344411 "Business Characterized by Triune Formation of Central Monitoring, Education and Outsourcing, Providing Overall Services Such As Home Security, Nursing, Internet, Community Information, Graphics Distribution, and the like in a Community-Based Framework"

Patent Document 18: Japanese Patent No. 2788910 "Home Security System (Remote Measurements of Consumptions, Perusals for Different Hours and from Remote Locations)"

Patent Document 19: Japanese Patent Laid-Open Publication No. 2005-164561 "Electrical power Measurement Scheme" iPB Patent Document 20: Japanese Patent No. 3538154 "System of Measuring and Billing for Consumptions of Electrical power, and the like and Method for Measuring and Billing for Consumptions of Electrical power, etc."

Patent Document 21: Japanese Patent No. 3447622 "Watthour Meter"

Patent Document 22: Japanese Patent Laid-Open Publication No. 2004-4084 "Watthour Meter"

Patent Document 23: Japanese Patent Laid-Open Publication No. 2004-233239 "Scheme for Remote Meter reading of Electrical power and System Thereof" (Multiple Measurements of Power consumption)

Patent Document 24: Japanese Patent No. 3339495 "Multi-Circuit Type Measuring Instrument"

Patent Document 25: Japanese Patent Laid-Open Publication No. 2003-222645 "Multi-Circuit Type Electrical power Measurement Device"

DISCLOSURE OF THE INVENTION

Problem to be Solved by the Invention

Since, with the aforementioned conventional technologies, power consumption for both the base voltage and the double-high voltage cannot be simultaneously measured with a single watthour meter, two separate watthour meters would be needed to measure power consumption for both the base voltage and the double-high voltage, and special space for installing watthour meters and arranging wires therefor need to be provided.

Furthermore, even if power consumption could be remotely measured, a contract capacity could not be altered. In addition to this, supply of electrical power could neither be stopped nor restricted when a power consumption exceeds an amount that has been predetermined for a certain period of time for the purpose of self-management on the consumer's part, when an instantaneous power consumption exceeds a contract capacity, or when an instantaneous power consumption exceeds a limit that has been set for safety reasons due to abnormalities of equipment, wiring, etc.

Furthermore, current or past power consumption cannot be perused from a remote location even if the systems were connected to a network. Power consumption for the base voltage and the double-high voltage could not be show in an alternate manner, either.

When signals that are transmitted from a watthour meter installed at a consumer's side to a supplier's side detailing the power consumption are cut off or failed for some reason, signals requesting signal transmission cannot be sent from the supplier's side to the consumer's side.

A watthour meter cannot be interlocked with a home security system that is equipped with a general purpose interface and is capable of accessing the Internet, nor does it make observations on the indoor conditions through a USB camera, and the like connected thereto. It cannot collect information about Internet-connected home electrical appliances and the open/close status of windows, doors, and the like through the interface to put in an online storage or to transmit through the network, nor can it be made to provide any clues as to the security status of consumers or their safety.

Moreover, since none of the aforementioned inventions have an OS (Operating System) installed, in order to add functions such as network-accessing capability, an individually designed program must be developed separately for each function for every piece of hardware on every occasion.

Means for Solving the Problem

The present invention provides means and a device for measuring electrical power that solve the aforementioned problems.

(Measuring and Billing for Both the Base Voltage and the Double-High Voltage with a Single Unit)

In the measurement of electrical power in the present invention, among three wires of single phase, one can measure, the first current ia flowing through the positive phase hot line which is one of the hot lines provided, and the cold line, and the first voltage v1 between the lines, the second current ib flowing through the negative phase hot line which is the other of the hot lines, and the cold line, and the second voltage v2 between the lines, and the third current i3 flowing through a load between the two hot lines, and the third voltage v3 between the lines; subtracting the third current i3 from the first current ia, the resulting value being multiplied by the first voltage v1 to yield the first electrical power w1=(ia−i3)·v1; subtracting the third current i3 from the second current ib, the resulting value being multiplied by the second voltage v2 to yield the second electrical power w2=(ib−i3)·v2; obtaining, as the sum of the two electrical powers, a total power consumption for the base electrical power w100=w1+w2=(ia−i3)−v1+(ib−i3)·v2; and obtaining, as the product of the third current i3 and the third voltage v3, a power consumption for the double-high voltage alone w200=i3·v3. Therefore, power consumption for the base voltage and the double-high voltage can be measured by a single watthour meter, and electricity charges can be billed according to rate structures for both voltages. The hot line of the positive phase described in the claims is sometimes referred to as a tip phase or T-phase. Similarly, the hot line of the negative phase is sometimes referred to as a ring phase or R-phase, and the cold line as a neutral line or N-phase. Measurements of the aforementioned current and voltage are instantaneous values, which, by integrating over unit time, yield power consumption.

(Cpu and Memory)

A watthour meter in accordance with the present invention has a CPU, a memory and output/input means and is capable of making a meter reading from a remote location; setting a contract capacity from a remote location; stopping and starting supply and distribution of electricity from a remote location; transmitting for the uploading of values such as measured power consumption and electricity charges not as the number of pulse counts often observed in conventional watthour meters but as telegraphic messages consisting of numerical values; controlling peripherals such as a home security system; and calculating power consumption for both the base voltage and the double-high voltage, each of which has different rate structure, according to the corresponding rate structure to yield electricity charges.

It should be noted that in the present specification a so called computer or calculating means including a CPU and memories will be referred to simply as a central processing unit or a CPU. Functions of the CPU in this specification are to control, calculate, store and input/output data. Distributed processing is also acceptable instead of central processing. It is for the purpose of showing examples only and does not limit the scope of the present invention.

The watthour meter in accordance with the present invention is equipped with storage means and clocking means, and power consumption measured by the aforementioned measurements method are stored using the standard time. Furthermore, the storage means may store power consumption rates that separately differ for the base voltage and the double-high voltage as well as the hours used to calculate power consumption charges within the watthour meter. Furthermore, the clocking means may also be equipped with standard time acquisition means to receive as well as means for receiving standard time via a wide area communication network and correcting a time lag.

(Remote Meter Reading)

In order to measure power consumption by each consumer, the electrical-power management facilities of the utility company and the watthour meter installed at the consumer's side are connected through communication means so that information about power consumption can be collected at any time. With this arrangement, a power distribution company can total up power consumption without having meter reading personnel physically visit various consumer locations. At the same time, there are following advantages as the result of remote meter reading. Conventionally, a watthour meter is usually placed outdoors for meter reading personnel to read during his/her round. However, this could help an ill-intentioned person obtain knowledge of whether anyone is home or not through the movement of the watthour meter and commit larceny. Since the watthour meter of the present invention can be placed indoors, knowledge of whether anyone is home or not can be prevented to be obtained by the ill-intentioned person.

(Connection Scheme Between the Electrical Power Supplier'S Side and the Watthour Meter on the Consumer'S Side)

By using the Internet as communication means for connecting management facilities of a power company, being the power supplier, and a watthour meter installed on the side of a consumer, being the user, it becomes possible to achieve control to stop and start the power supply to the watthour meter on the consumer's side from the supplier's side, request transmission of signals regarding power consumption, connect and control-equipment such as home security devices from the watthour meter, and peruse power consumption status through the Internet by the consumer and a third person such as those concerned with the consumer. When connecting through the Internet, by providing combined functions such as encrypting data for invisualization, or prohibiting unauthorized access by password protection, etc., the violation of privacy or alteration of data can be prevented. Since the consumer can peruse his/her power consumption over time, he/she can grasp trends and characteristics of his/her power consumption, helping him/her devise plans to curtail power consumption.

(Alteration of Contract Capacity)

By providing a consumer with large capacity wiring for power supply in advance and setting a contract capacity by downloading the setting from the supply side, a contract capacity can be altered without dispatching a worker to the consumer's side for wiring work. This is an advantage that it will be simple and quick, for example, to increase the contract capacity for two months during the summer and return it to the original setting in the fall.

(Breaker Function)

A watthour meter of the present invention is capable of controlling input breaking means (switch, NFB, breaker, and the like) of the power line supplying electrical power under the control of higher-level control means. This function is utilized in the case where, with an objective being to restrain the peak value of power consumption within a certain area such as an apartment building, the supply side and the consumer agree, by a contract, that power supply may be stopped during peak hours of power consumption such as past noon in the middle of the summer or morning hours in the middle of the winter, but in return electricity charges for the power supply are set at lower prices. In such an instance, the power supply is stopped under the control of the higher-level control means during the peak hours of power consumption within the area, or in the case where the power supply is stopped because of the non-payment of electricity charges or relocation on the consumer's part. Although such functions can be performed using regular breakers when power consumption exceeds the contract capacity for a short period of time, the watthour meter is capable of stopping the power supply under the control of the higher-level control means from a remote location or under the decision and control of the built-in CPU within the watthour meter.

Similarly, restart can also be performed remotely, but, for safety reasons, workers can also conduct work manually if necessary. When the power consumption over a short period of time exceeds a predetermined value for reasons of electrical leakage from the wiring, short circuit of the components, and the like, the power supply can be stopped by the decision of the CPU located in the watthour meter or by the signal from the higher-level control means. Similarly, restart can also be performed remotely, but, for safety reasons, workers can also conduct work manually if necessary. The time interval for the measurement of instantaneous power consumption is set in advance to be a data collection interval of, for example, 0.1 seconds or more, or more preferably 0.2 to 0.5 seconds. Although the shorter interval between the adjacent measurements means that it is safer in guarding against electrical leakage, it also means that the amount of measured data becomes larger, requiring more memory capacity.

(Function of Remotely Controlling the Stop and Start of Power Supply)

Since one can remotely control the watthour meter from the power supply side, when the power consumption exceeds the upper limit for a period set in advance by the consumer or the contract capacity, the power supply can be remotely stopped by signals sent from the supply side. Furthermore, in the case where the power supply within an area is limited, if, for example, the need to systematically reduce the amount of power supply arises during the peak hours of power consumption such as past noon in the middle of summer, the power supply to certain consumers can be stopped or reduced under the control of the supplier based on a contract agreed to in advance. Similarly, it is also possible to conclude a contract where an upper limit for power consumption for a certain period of time is provided and, when power consumption exceeds the upper limit, the power supply is stopped. At the same time, in the case of fire or non-payment of electricity charges on the consumer's part, the power supply to the consumer can be stopped by a directive sent from the supplier via the Internet.

(Time Category)

In addition to the daytime and latenight categories, the peak hours in the afternoon, for example, can be thought of as another category for a different rate. New categories in the rate structure such as A-category and B-category can be established, where, in the A-category, electrical power is provided in the conventional scheme, but, in the B-category, a contract is concluded where a lower rate is agreed to but, in return, reduces or stops power supply to the consumer by a directive sent from the supply side when the power consumption within the consumer's area (for example, a district or an apartment building) becomes excessive during peak hours of power consumption past noon in the summer and the like. To the consumers, electricity can be used at a reasonable price during normal hours, and to the supplier, the peak power is restrained and a capacity of power plant does not need to be excessed. Furthermore, from a global standpoint, it is preferable in terms of energy conservation and resource conservation. Settings of the categories are downloaded to the watthour meter in accordance with the present invention from the higher-level control means and stored in the built-in storing means of the watthour meter.

(Remote Perusal)

With regard to power consumption over time, by uploading power consumption information at a certain interval to the power supplier's side by a CPU equipped in the watthour meter, power consumption status over a short period of time can be grasped from a remote location, which makes it possible to, for example, provide knowledge as to the safety of an elderly person living alone to his/her relatives, and the like at a remote location, make consumers aware of any power wastage and promote systematic use of electricity through the knowledge of their own power consumption status, or find an electrical leakage at an empty residence. More specifically, data of watthour meter can be perused via the Internet after uploading the data to the higher-level control means, storing the data in the control means, and providing information protection means for the stored data such as user ID and password or an encoding and decoding scheme.

(Short Time Values)

Moreover, as to the power consumption data, the record of power consumption at intervals of an arbitrary electrical power totaling time ranging from 10 minutes to two hours, or at 30-minute intervals for example, can be retained for a watthour data retention period of, for example, 31 days or more, or 35 days or more preferably 65 days or more, which is set in advance based on the level of the memory capacity available. The reason why the watthour meter needs to retain memory is to keep the record of power consumption in case transmission of information regarding the power consumption from the watthour meter to the higher-level control means fails for some reason.

The 31 days are based on the maximum number of days within one month for which an electrical power supplier sends a bill to consumers. The 65 days are based on the memory capacity being capable of retaining power consumption data for an entire month even if the transmission of power consumption data from the watthour meter to the higher-level control means fails for some reason at some point in time between a once-a-month meter reading and the next meter reading and takes several days to be restored.

Storage capacity may be larger although it requires more memory capacity and increases the production costs of the watthour meters as well as requiring allocation of unnecessary memory area when operating. However, the additional cost would be tradeoff against the advantage of retaining power consumption data and would not be an impediment in the present invention.

Furthermore, built-in control programs would make the self-checking function and the periodic checking function possible. Moreover, the perusing function for the power consumption can be realized with display panels such as LEDs. For example, by pressing a display changing switch, displays of the total power consumption, the power consumption for the base voltage and the power consumption for the double-high voltage can be toggled in turn. Moreover, the display can be set to return to the total power consumption after a certain period of time has passed regardless of what is being shown, or can be made to show power consumption for different hours, different seasons, and the like by inputting commands. Similarly, whether the electrical power is in supply mode or shutdown mode can be shown.

In these circumstances, if transmission of signals from the consumer side to the supplier side fails for some reason, it is possible to transmit signal request signals (polling signals) to watthour meters installed at the consumer side. Moreover, power consumption to be transmitted is not the number of pulses as in the case of conventional watthour meters but telegraphic messages consisting of numerical values. These telegraphic messages to be transmitted may be encoded in order to prevent transfer errors or for various security reasons. For example, the messages may be encoded in the watthour meter and transmitted, and then received and decoded in the external measurement control device. In this instance, in the present specification, a telegraphic message means a character string that carries data such as power consumption over transmission from a watthour meter to a higher-level control means, and it takes the form of, for example, the number of a watthour meter (IP address), time of day, unit time (30 minutes, and the like), voltage (base voltage or double-high voltage), power consumption, delimiters, and the like.

Furthermore, as to the power consumption data, records of power consumption made, for example, every 30 minutes can be retained for the period of, for example, 35 days or 65 days, which were set in advance according to the memory capacity. Moreover, built-in control programs will enable the self-checking function and the periodic checking function. Moreover, the perusing function for the power consumption can be realized with display panels such as LEDs. For example, by pressing a button, displays of the total power consumption, the power consumption for the base voltage and the power consumption for the double-high voltage can be toggled in turn. In addition to this, it is also possible to display the corresponding electricity charges together. Moreover, the display can be set to return to the total power consumption after a certain period of time has passed regardless of what is being shown. Similarly, whether the electrical power is in supply mode or shutdown mode can be shown.

(Multiple Interfaces)

If a watthour meter is equipped with a plurality of interfaces like wireless LAN capabilities such as NIC, RS485, RS232C, PLC and IEEE802, or with radio communication capabilities such as data modulation, a data bus for earth leakage breaker function, a USB, and the like, it will be able to be connected to a variety of peripherals to achieve various functions. These include, for example, various sensors such as gas leakage detectors, fire alarms, overheat detectors, water leakage detectors, shock detectors and infrared intruder detectors, open/close control means for rain doors and shutters, shut down means for gas or microwave ovens, and the like. Furthermore, if the interfacing standards of the watthour meter include not only those unique to the watthour meter in accordance with the present invention but also those for general purpose interfaces, it will be able to be connected to general purpose devices that are not particularly developed for the watthour meter like CCD cameras having the USB interface or home information appliances such as refrigerators, air conditioners, microwave ovens, TV sets and answering machines. The aforementioned peripherals are for the purpose of illustrating examples only and do not limit the scope of the present invention.

(Support for Home Security Systems)

Safety can be enhanced through control of the operation and condition of switches (NFB, and the like) provided on the consumer side, safety measures such as power shutdown linked to fire alarms, smoke detectors, electrical leakage detectors, gas leakage detectors, and the like, and support with proper operations during exceptional situations. For example, by connecting a USB camera with a microphone, indoor monitoring can be linked, or open/close operation of doors, shades, ventilating fans, air vents, and the like can be performed.

(Use of OS)

If a developer intends to develop system parts having certain functions using ASIC or DSP, the developer must worry about initial costs and the design period. However, since the present invention utilizes OSs such as Linux, TRON and window CE or an original OS, it is only necessary to write programs for those developments, and therefore the development time and the number of processes can be reduced.

In the case of upgrading the built-in programs for input breaking control or calculation with a new version, modifying, for example, the IP address from v4 to v6, or upgrading the OS itself, if ASIC or DSP were used, then functional upgrading of programs would require the replacement of parts themselves. However, since the watthour meter of the present invention is equipped with a computer, new programs can be installed via the network, and the need for workers to be sent to the site of the watthour meter to modify programs or IP addresses can be reduced. Pieces of hardware that can be programmed, such as PLD or FPGA, may be used. In this instance, modification involving PIv4 and PIv6 will also be referred to broadly as "upgrading of the OS."

(Separation of the Watthour Meter Section and Interface Section)

By designing the watthour meter section and the interface section as separate units, maintenance or replacement of components can be conducted efficiently. However, they may be integrated as a single unit.

(Use of Dynamic Local Address)

Furthermore, as to the IP address to be assigned to each dwelling unit, i.e., each watthour meter, since assigning a global static address to each watthour meter requires the same number of IP addresses as that of consumers and makes whole processes expensive, dynamic local addresses can be used instead in the present invention. That is, the higher-level control means situated at an external control center keeps IP addresses of a number fewer than the total number of watthour meters and assigns an IP address to a watthour meter each time the watthour meter engages in communication. A control table is provided in the higher-level control means (functioning as a DHCP server) so that it can keep a record of which watthour meter (functioning as a DHCP client) corresponds to which IP address. Moreover, the control table can be rewritten by a software program and via bidirectional communication so that, even if the IP address is changed, identification of which consumer corresponds to the IP address is possible. Although typical practice concerning Internet-connected home electrical appliances such as microwave ovens and refrigerators is to individually assign static addresses to these appliances, in the case of watthour meters of the present invention, they are assigned dynamic IP addresses as if they were watthour meters having router capabilities. Since the watthour meter does not measure power consumption by pulses as conventional watthour meters for the transmission or reception of data about power consumption do, it does not have to be constantly connected to the Internet. Therefore, the higher-level control means is saved the trouble of keeping a large number of IP addresses. In one example, a single IP address is assigned to the information management room of an apartment building that includes a group of more than one consumer, and the IP address is assigned in turn to each of the watthour meters so that data about power consumption of individual consumers can be accumulated and collected. In the case where the watthour meter is equipped with processing capabilities to calculate power consumption and make a determination of whether power supply is to be stopped or not on its own, the frequency of transmission of information to the higher-level control means can be reduced, and in doing so, the connect time becomes very short. As an extreme example, the higher-level control means may retain a single IP address and dynamically assign that IP address to a plurality of watthour meters, so that the higher-level control means can initiate a connection. The reason why this can be done is because a means for storing data is located in the watthour meter. Moreover, not pulses but numbers and telegraphic messages that contain compressed information are to be transmitted so that the connect time can be reduced. Even in such cases, it is necessary that the watthour meter has processing capabilities.

(Retaining Data within the Same Network Area)

Moreover, in the present invention, before sending the power consumption of individual dwelling units directly to the measurement control device at the external control center, it is possible to deliberately construct a housing complex local network within an apartment building or an area that includes dwelling units and provide a lower-level control means and to temporarily store and retain data in the lower-level control means, thereby keeping the collected data or measuring and accumulating new data even in an environment where a communicational infrastructure is damaged due to disasters such as an earthquake. As to the positive and negative phases of the base voltage and the double-high voltage for individual dwelling units, configure it such that data about power consumption every 30 minutes can be retained for a period of, for example, two months or more. The lower-level control means may include a monitoring means for monitoring whether information transmission capabilities of an external communicational infrastructure, i.e., a wide area network is working properly or not, an emergency power for the local network to be able to independently function in an emergency situation so as to switch the power source to the emergency power when the wide area network fails and transmit information stored in the storing means of the power consumption measuring device to an emergency backup storing means via the local network.

Effect of the Invention

By using the present invention, one can separately measure both power consumption of the base voltage and those of the voltage of about the twice the base voltage (double-high voltage), which have different rate structures, with a single watthour meter requiring an extremely small installation space, it will become possible to conduct meter reading for power consumption from a remote location, and it can be realized to peruse conditions of power usage from a remote location, to alter a contract capacity, to remotely control the supply of electrical power, display power consumption of the base voltage and those of double-high voltage together, and separately calculate electricity charges according to different rate structures, to be equipped with home security functions, and to easily rewrite programs because of the built-in OS. Furthermore, as to the voltage of 100 V, since power consumption of the positive phase and those of the negative phase are obtained separately, the present invention is useful when, for example, one wish to know which systems or components are consuming more electrical power, a clue to electrical leakage or equipment troubles, or whether there is an imbalance between power consumption of the positive phase and the negative phase.

EXPRESSION OF REFERENCE LETTERS

Figure 1:
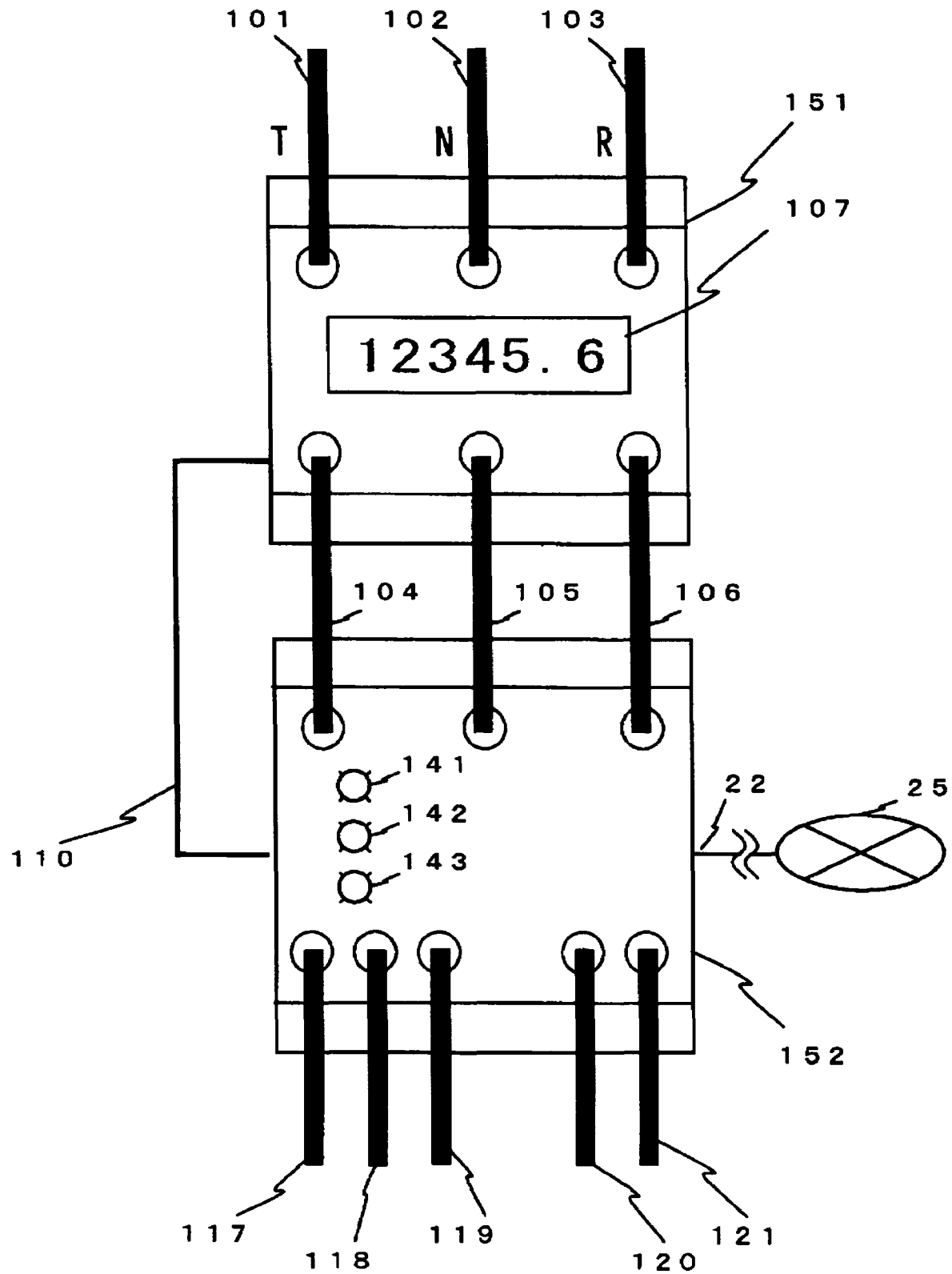
[FIG. 1] Front view and connection diagram of the total watthour meter and the single voltage watthour meter section.

12: Transformation equipment.
13: Housing complex.
14: Dwelling unit of consumer.
16: Electrical power measurement control equipment.
21: Electrical power measurement equipment.
22: Measurement communication line (local network).
23: Measurement control device (lower-level control means).
25: Internet (wide area network).
26: Watthour measuring device.
27: Remotely breaking means at the most upstream of non-priority (low quality) 100 V power supply line.
31: 100 V power supply line of low priority for breakage.
32: 100 V power supply line of high priority for breakage.
33: 200 V power supply line.
90: Electrical power company or power producer and supplier (PPS).
91: High voltage/extra-high voltage power transmission line.
101: Hot line (positive phase) from electrical power supply side.
102: Cold line from electrical power supply side.
103: Hot line (negative phase) from electrical power supply side.
104: Hot line (positive phase) connecting the total watthour meter and the individual watthour meter.
105: Cold line connecting the total watthour meter and the individual watthour meter.
106: Hot line (negative phase) connecting the total watthour meter and the individual watthour meter.
107: Watthour display panel.
110: Data bus connecting line.
117: Hot line (positive phase) connecting the individual watthour meter to the load; for the base voltage.
118: Cold line connecting the individual watthour meter to the load; for the base voltage.
119: Hot line (negative phase) connecting the individual watthour meter to the load; for the base voltage.
120: Hot line (positive phase) connecting the individual watthour meter to the load; for the double-high voltage.
121: Hot line (negative phase) connecting the individual watthour meter to the load; for the double-high voltage.
141: Display LED panel for functional confirmation.
142: Display LED panel for non-payment of electricity charges.
143: Display LED panel for overload.
151: Total watthour meter.
152: Individual watthour meter with peripherals controlling capabilities.
170: Display changing switch.
208: Inlet of power supply.
209: Data bus (RS232C, etc.)
210: Data bus (RS232C, etc.)
308: Data bus (RS232C, etc.)
309: Data bus (RS232C, etc.)
310: Outlet of power supply.
312: Connection to a breaker.
313: Data bus (LAN, etc.)
314: Data bus (RJ485, etc.)
315: Data bus (RS232C, etc.)
316: Data bus (USB, etc.)
160: Load of 200 V system.
100 V: Base voltage.
200 V: Double-high voltage.
B: Remotely breaking means for 200 V distribution line.
BX: Remotely breaking means for 200 V power supply line.
CX: Remotely breaking means for power supply line 31.
DX: Remotely breaking means for power supply line 32.
C(1): Remotely breaking means for a line receiving power supply from 31 and distributing power to J(1).
C(2): Remotely breaking means for a line receiving power supply from 31 and distributing power to J(2).
C(3): Remotely breaking means for a line receiving power supply from 31 and distributing power to J(3).
C(N−1): Remotely breaking means for a line receiving power supply from 31 and distributing power to J(N−1).
C(N): Remotely breaking means for a line receiving power supply from 31 and distributing power to J(N).
D(1): Remotely breaking means for a line receiving power supply from 32 and distributing power to K(1).
D(2): Remotely breaking means for a line receiving power supply from 32 and distributing power to K(2).
D(3): Remotely breaking means for a line receiving power supply from 32 and distributing power to K(3).

D(N−1): Remotely breaking means for a line receiving power supply from 32 and distributing power to K(N−1).
D(N): Remotely breaking means for a line receiving power supply from 32 and distributing power to K(N).
J(1): Electrical appliance of the first priority.
J(2): Electrical appliance of the second priority.
J(3): Electrical appliance of the third priority.
J(N−1): Electrical appliance of the (N−1)st priority.
J(N): Electrical appliance of the Nth priority (electrical appliance of the lowest priority).
K(1): Electrical appliance of the first priority.
K(2): Electrical appliance of the second priority.
K(3): Electrical appliance of the third priority.
K(N−1): Electrical appliance of the (N−1)st priority.
K(N): Electrical appliance of the Nth priority (electrical appliance of the lowest priority).
ADC-1: Analog-digital converter (for the measurement of current/voltage of positive phase base voltage).
ADC-2: Analog-digital converter (for the measurement of current/voltage of negative phase base voltage).
ADC-3: Analog-digital converter (for the measurement of current/voltage of double-high voltage).
CPU-1: Central processing unit for the measurement of total watthours.
CPU-2: Central processing unit for the measurement of electrical power of double-high voltage load alone and for the control of electrical power supply.
CT1: Current transducer (for the measurement of current of positive phase base voltage).
CT2: Current transducer (for the measurement of current of negative phase base voltage).
CT3: Current transducer (for the measurement of current of double-high voltage load alone).
L: Limit switch.
M: Motor for breaking power supply.
N: Cold line.
R: Hot line of negative phase (ring phase).
T: Hot line of positive phase (tip phase).
RB: Remotely breaking means for breaking by remote a power distribution (supply) line.
RBX: Transmission/reception line for a remote breakage signal to RB and a status signal (whether connected or broken) of RB.
VP1: Potential difference measuring instrument (for voltage measurement of positive phase base voltage).
VP2: Potential difference measuring instrument (for voltage measurement of negative phase base voltage).
VP3: Potential difference measuring instrument (for voltage measurement of base voltage load alone).

BEST MODE FOR CARRYING OUT THE INVENTION

Embodiment 1

Embodiments of the present invention will be described hereinafter with reference to the drawings.

Figure 4:
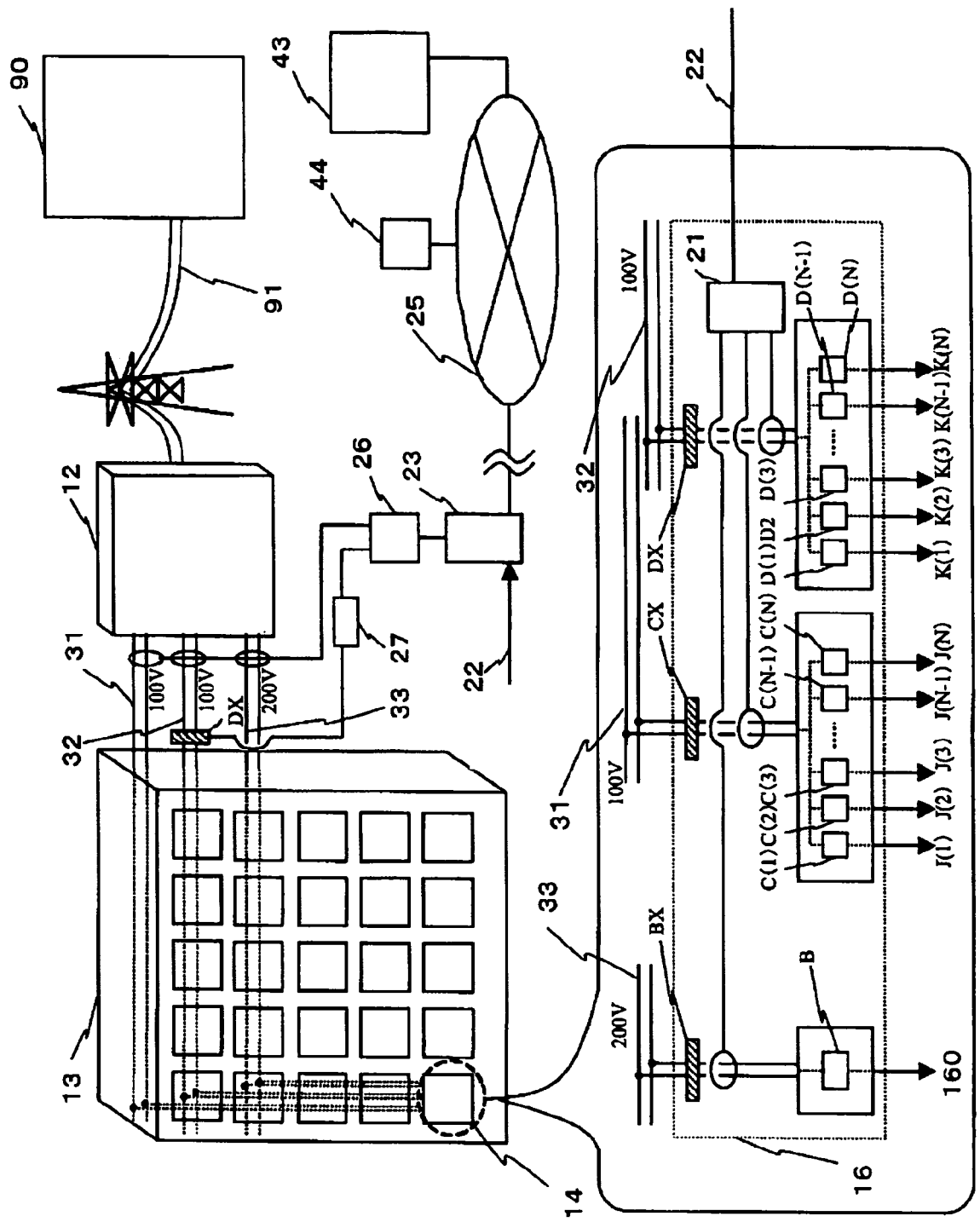
[FIG. 4] Conceptual diagram of the electrical power control system.
Figure 5:
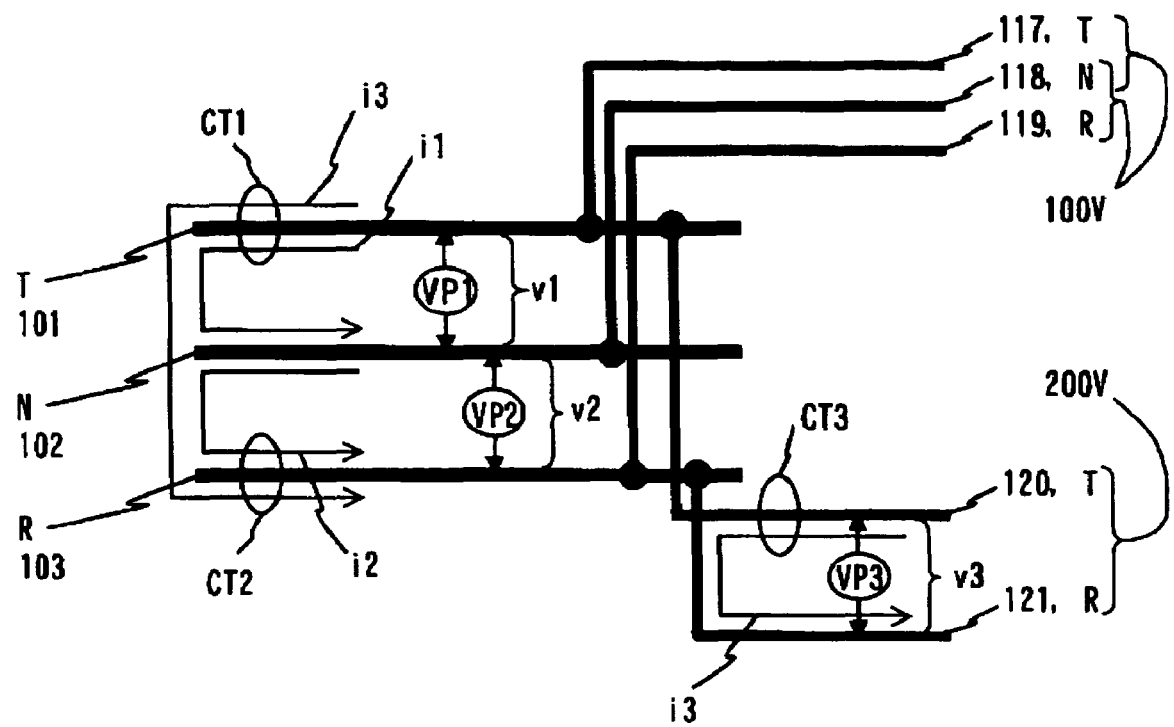
[FIG. 5] Conceptual diagram of power consumption measurement.

The entire picture of a system where watthour meters of the present invention are used will be shown in FIG. 4. Electrical power is supplied to ordinary households, factories, commercial buildings for tenants, etc. from an electric utility or a private power plant via a distribution network 91. For example, in a housing complex such as an apartment building 13 or a building for tenants, the electrical power is received by a transformation device 12 such as a cubicle and distributed and supplied to consumers 14 such as individual rooms or individual tenants-through a private single-phase three-wire distribution network 31, 32 and 33. Although 31, 32 and 33 are expressed by six lines in total with each being expressed by two lines, any one of them consists of two wires taken from the three wires as shown in FIG. 5 later. The total power consumption at the apartment building 13, etc. are measured by a total watt-hour measuring machine 26. An electrical power supply company sends an electricity bill based on the total power consumption to a large-volume consumer such as a residents' association 13, etc., and the residents' association 13 individually sends electricity bills to consumers 14 in different rooms based on the power consumption of their rooms. Electrical power is supplied to each consumer 14 in different rooms through the single-phase three-wire distribution lines 31, 32 and 33, where electricity of the base voltage (about 100 V for example) is supplied through lines 31 and 32 and electricity of the double-high voltage (about 200 V) through line 33. For the power consumption of the consumer 14, voltages and currents are measured every time by the measuring section 21 within the watthour meter 16 of the present invention. Measured power consumption are transmitted to a lower-level control means 23 via a local network communication line 22. Measured currents, voltages, watthours, etc. are transmitted as telegraphic messages at a predetermined time interval of, for example, 0.2 or 0.5 seconds. Power consumption of individual consumers are totaled up by the lower-level control means 23, and the residents' association sends the bill to the consumer 14 at each dwelling unit. Since, as a large-volume consumer, the residents' association receives power supply at an inexpensive rate and distribute it among consumers 14 at individual dwelling units, it is possible that those consumers 14 at individual dwelling units receive power supply at a less expensive price than having a power contract on its own. The lower-level control means 23 installed at the residents' association sends data to a control system 43 on the power supplier's side via a wide area network 25 such as the Internet, and the power supply company sends an electricity bill to the residents' association based on the total power consumption. Moreover, it is possible that the consumer peruses his/her own power consumption status on a display terminal 44 placed outdoors via the wide area network 25. The display terminal may be a personal computer connected to the Internet, and perusing locations may include offices, place of stay while on a journey or a business trip, friend's home and Internet cafes, where one accesses the Internet over the wire or by radio, or trains, automobiles, taxi, ambulance, etc. in motion, from which one accesses the Internet by radio.

The control system 43 makes, for example, decisions and controls as follow. Suppose one wants to restrain the peak power when the power consumption of the consumer group 13 increase in the afternoon in the summer, etc. If the control system 43 measures and grasps the power consumption of the consumer group 13 at the lower-level control means 23 and decides that the power consumption are large, then it actuates a power supply breaking means DX to break the power supply to one 100 V system. Here, a contract has been entered with the consumers 14, where they recognize that the power could be interrupted at the time of peak power by priority but the power rate would be set low instead. Similarly, instead of breaking the power supply line to the consumer group 13, a specific distribution line within the dwelling unit of individual consumer 14 may be broken. Here, BX designates a remotely breaking means for the 200 V power supply line. Likewise, CX designates a remotely breaking means for one of the 100 V power supply line and DX another remotely breaking means for the other of the 100 V power supply line. Means for individually breaking even a plurality of distribution lines within one power consumer section from a control hub at a remote location (B, C(1) through C(N), and D(1) through D(N)) are also shown, and these may be selectively employed. It should be noted that J(1) designates an electrical appliance of the first priority. Similarly, J(2) an electrical appliance of the second priority, J(3) an electrical appliance of the third priority, J(N−1) an electrical appliance of the (N−1)st priority, J(N) an electrical appliance of the Nth priority (the electrical appliance of the lowest priority), K(1) an electrical appliance of the first priority, K(2) an electrical appliance of the second priority, K(3) an electrical appliance of the third priority, K(N−1) an electrical appliance of the (N−1)st priority, and K(N) an electrical appliance of the Nth priority (the electrical appliance of the lowest priority).

FIG. 1 shows the exterior of the watthour meter of the present invention and the connection arrangement. In FIG. 1, the one at the top is the total watthour meter section 151, and the one below is the single voltage watthour meter section 152 with control function of peripherals for only base voltage or double-high voltage, showing a double unit arrangement. The arrangement does not limit the scope of the present invention and may be replaced with a single unit arrangement or more units as necessary. If the shape of the watthour meters of the present invention is the same as that of conventional watthour meters widely available in a market, then, conveniently, no new work or designing would be required when replacing watthour meters.

Three lines, namely, the positive phase line 101 which is one of the two hot lines, the cold line (N phase) 102, and the negative phase line 103 which is the other of the two hot lines, enter the watthour meter 151 from wiring of single phase three line. There are power supply lines of the hot lines and cold line from the total watthour meter 151 to the single voltage watthour meter section 152 (104, 105 and 106 corresponding to 101, 102 and 103, respectively). A total watthour display panel 107 displays power consumption of the base voltage, the double-high voltage and the combined power consumption of the two voltages. Corresponding electricity charges may be displayed there.

Display panels 141, 142 and 143 are, for example, an "operation confirmation LED" that indicates that the watthour meter of the present invention is functioning, a "non-payment of electricity charges LED" that indicates that, for example, the consumer has not paid electricity charges and the power supply has been stopped, and an "overload LED" that indicates that the breaker has been actuated because of, for example, electrical leakage and the power supply has been stopped, respectively. The details of the display panels and the number thereof are for the purpose of showing examples only and do not limit the scope of the present invention. The indications are controlled by a built-in control program of the CPU or by the higher-level control means 43 via local network 22. The breaker can be operated from the CPU of the watthour meter of the present invention, and, at the same time, disconnection, reengagement, operational confirmation, etc. can be performed manually like conventional breakers. As to the reengagement, if the power supply was interrupted because of an overload, it would be typical to perform reengagement manually in order to confirm safety. However, it would still be possible to remotely control the reengagement from the higher-level control means 43. Details of the function are for the purpose of illustrating examples only and do not limit the scope of the present invention. Power supply lines 117, 118 and 119 supply the base voltage of, for example, 100 V and power supply lines 120 and 121 the double-high voltage of, for example, 200 V to loads in households, etc. Although each power supply is chosen to consist of one system, it is for the purpose of illustrating examples only and does not limit the number of systems.

The total watthour meter 151, which has a CPU inside, measures and displays watthours, communicates with peripherals and transmits/receives signals to/from the watthour meter section 152 of a single voltage of either the base voltage or the double-high voltage which has a control capability. It has a connection 110 to transmit/receive signals to/from the single voltage watthour meter section 152. Furthermore, it is also equipped with, for example, a general purpose bus such as RS232C, so that a meter reading personnel or a worker can have a device such as a personal computer connected thereto to read or write data or programs. The choice of RS232C as a bus is for the purpose of illustrating examples only and does not limit kind or number used in the present invention. If it is equipped with a plurality of RS232C buses, then, for example, one of the RS232C buses can be used exclusively for continuous transmission of signals of power consumption at a predetermined time interval of, for example, 0.2 to 0.5 seconds. In case signals were not transmitted for some reason, the other RS232C bus can then be used for receiving signal request signals (polling signals) from the watthour meter, etc.

Moreover, it may be equipped with an RS232C bus, an RS485 bus, etc., so that, for example, a meter reading personnel or a worker can connect a device such as a personal computer thereto to read or write data or programs. A breaker may be connected. A bus such as USB may be used to communicate with external equipment such as monitor cameras, various home security devices, etc.

For the base voltage (100 V for example) and the double-high voltage (200 V for example), one set of supply lines is depicted for each as an example, namely, T-phase 117, N-phase 118 and R-phase 119 for the base voltage and T-phase 120 and R-phase 121 for the double-high voltage. However, multiple sets of supply lines may be provided for either the base voltage or the double-high voltage or for both. The aforementioned rate categories may be established as A-category and B-category, where electricity of one category (A-category, for example) is constantly supplied except in the case of troubles such as electrical leakage or non-payment of electricity charges, and electricity of the other category (B-category, for example) is agreed by a service contract to be interrupted when, for example, power consumption within a certain area or a certain section such as an apartment building during peak hours of power consumption such as the afternoon in the summer become too large. The example is the two of 100 V systems 31 and 32 in FIG. 4.

It is connected to the Internet via an NIC bus such as RJ45. Such connection is used when a consumer him/herself (irrespective of whether he/she is a person or a corporation) or a person concerned such as a member of his/her family peruses power consumption conditions from a remote location, or when the power supplier rewrites built-in programs.

It may be designed to be compatible with radio signals transmission and reception standards such as a transceiver capability of PHS so that transmission and reception of signals, connections to devices, the Internet connection, etc. can be realized. The shape, standards, usage, the number, etc. of the bus shown here is for the purpose of illustrating examples only and do not limit the scope of the present invention.

Moreover, when connecting a plurality of watthour meters of the present invention installed at neighboring dwelling units of an apartment building, such connection may be accomplished by radio instead of over the wire. Especially, in the case of radio connection, a means for protecting information by ID and passwords or encoding and decoding is preferable. Furthermore, in the case of radio connection, by establishing network connection in the form of daisy chain, it will be possible to realize the network within the area by small-size and light-weight equipment with low-intensity transmission radio waves. The reason for this is as follows. When collecting information at the control means, individual watthour meters must transmit signals with enough transmission output so that the signals can reach the control means. In contrast to these individual transmissions, in the daisy chain transmission, one watthour meter transmits data to a nearby watthour meter in succession, so that information is accumulated as it travels along and the entire information reaches the control means at the end. Therefore, although, in the individual transmission, the watthour meter at the most distant location from the control means must have a transmission output that is large enough to transmit signals to that control means, in the daisy chain transmission, only a transmission output that is large enough to send signals to the neighboring watthour meter is required.

Figure 2:
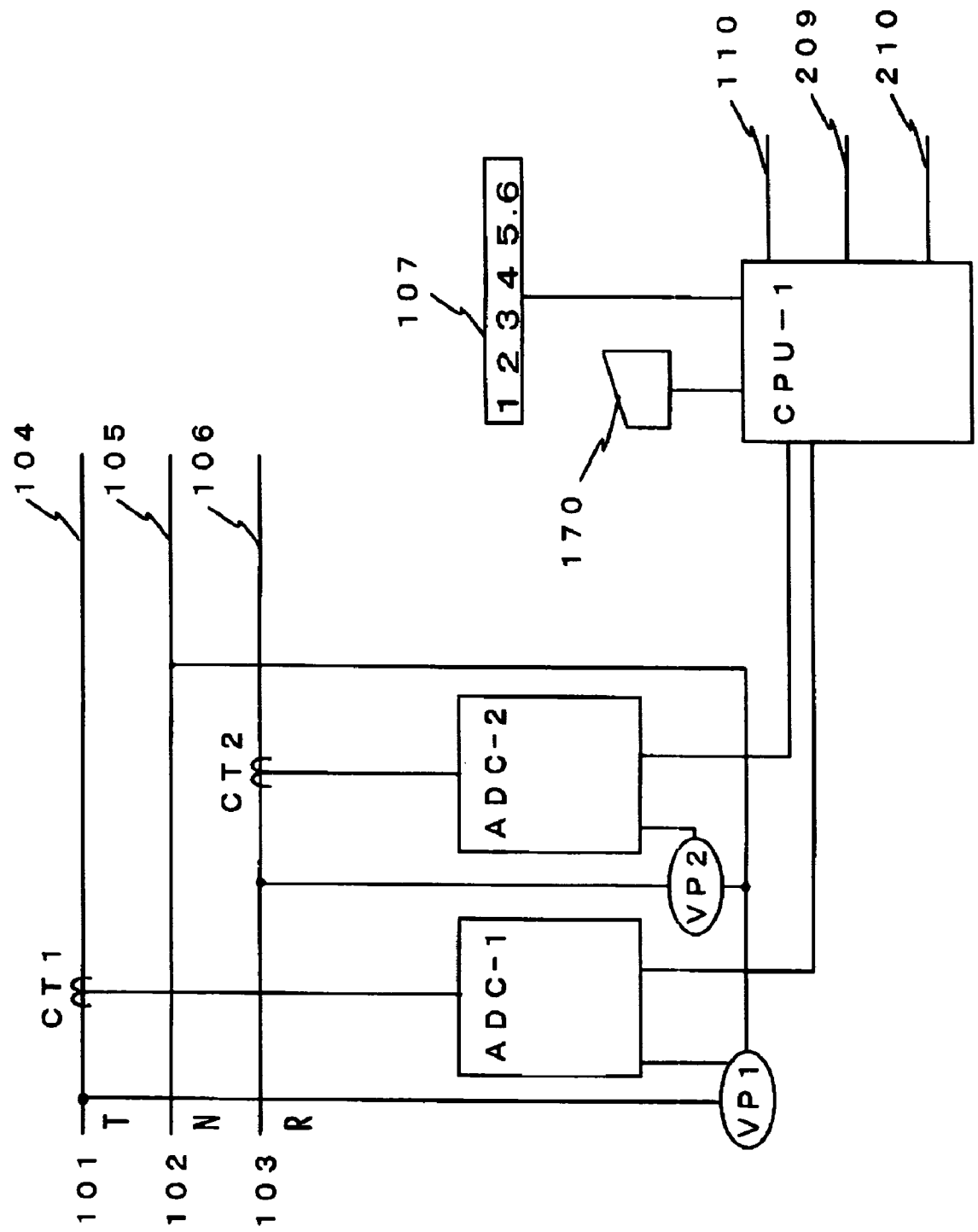
[FIG. 2] Block diagram of the total watthour meter.

FIG. 2 shows a block diagram of the watthour meter 151. T-phase 101, N-phase 102 and R-phase 103 of the single-phase three-wire line output through distribution lines electrical power to the single voltage watthour meter section 152. At the same time, currents flowing between the cold line and the T-phase and the R-phase (ia and ib, respectively) are measured by CT1 and CT2, respectively, and voltages between the T-phase and the cold line and between the R-phase and the cold line (v1 and v2, respectively) are measured by VP1 and VP2, respectively. Signals from the ammeter CT1 and the voltmeter VP1 go to an analog-digital converter ADC-1, and signals from the ammeter CT2 and the voltmeter VP2 go to an analog-digital converter ADC-2, both being further sent to the central processing unit CPU-1.

The CPU-1 receives values of current and voltage of the R-phase and the T-phase, calculates watthours consumed, and sends the total watthours consumed to the single voltage watthour meter section 152 that is capable of communicating with peripherals and controlling. For the transmission, for example, an RS232C bus is used. Moreover, the display panel 107 such as LEDs having a perusing function for power consumption can be realized. For example, total watthours of a certain period are usually displayed, and by pressing a button, displays of total power consumption, power consumption of 100 V and power consumption of 200 V for a certain period or a month, for example, can be toggled in turn. Moreover, the display returns to the total power consumption after a certain period of time has passed regardless of what is being shown. Furthermore, the display may be set to show each power consumption within a prescribed short period of time such as 30 minutes. Details of the display are for the purpose of illustrating examples only and do not limit the scope of the present invention.

Figure 3:
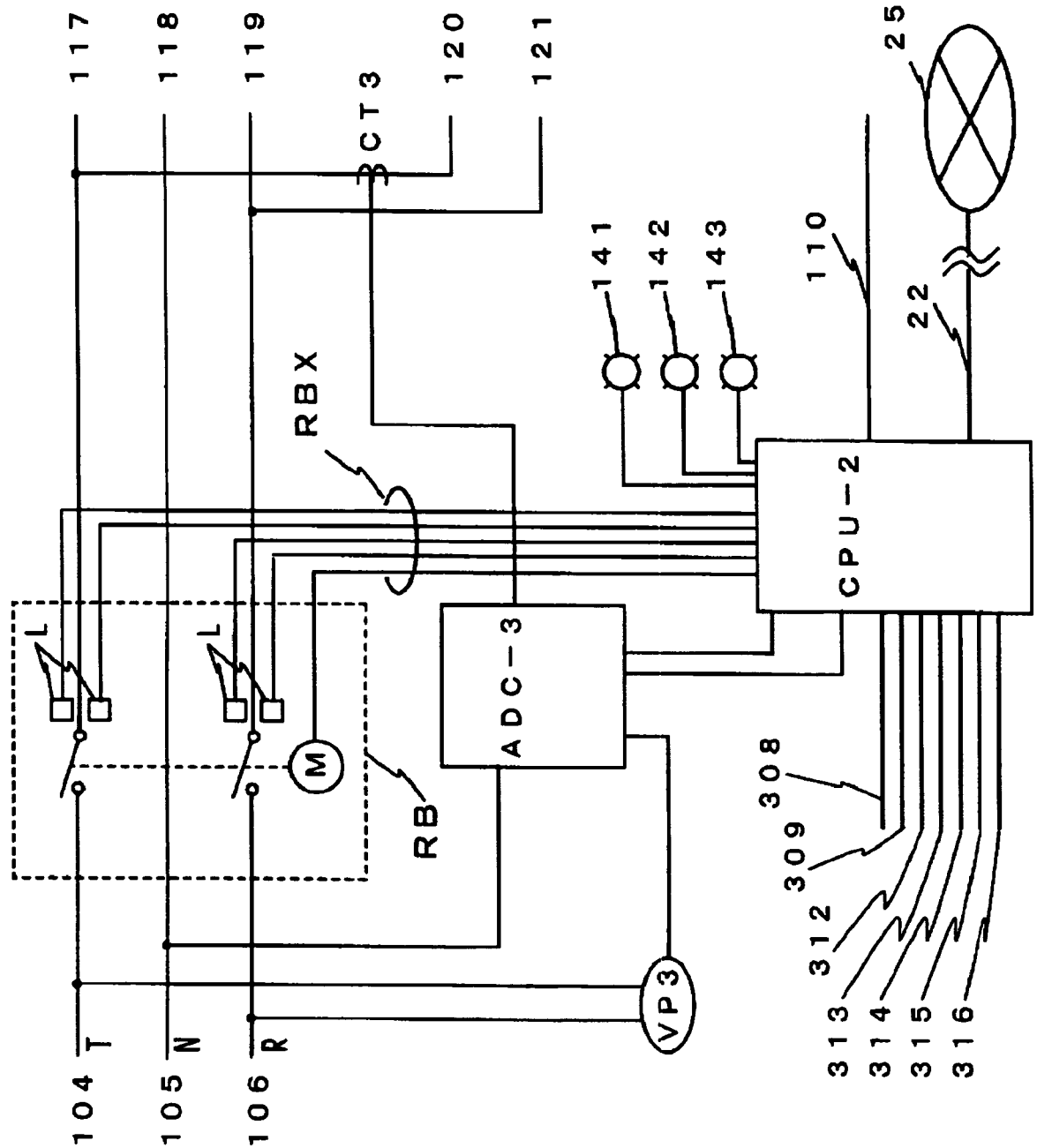
[FIG. 3] Block diagram of the single voltage watthour meter section.

FIG. 3 shows a block diagram of the single voltage watthour meter section 152 of the base voltage or the double-high voltage that is capable of communicating with peripherals and controlling.

It receives the T-phase, N-phase and R-phase (104, 105 and 106, respectively) of the single-phase three-wire line through distribution lines from the total watthour meter section 151. In FIG. 3, a current (i3) flowing through a load on which the double-high voltage (an example of 200 V is shown here) is applied is measured by CT3, and a voltage (v3) applied on a load by the analog-digital converter ADC-3 is measured by VP3. Then, together with data sent from CPU-1, electrical power is calculated by CPU-2 as the product of the voltage and the current (i3·v3). Although an example of calculating power consumption for double-high voltage (200 V in the present example) alone is shown in FIG. 3, power consumption for the base voltage (100 V in the present example) alone, which is applied on a load on the T-phase or the R-phase, may be measured. Locations for measuring the current and voltage are shown for the purpose of illustrating examples only and do not impose limitation. In FIG. 3, since power consumption for one of the base voltages were obtained, by performing subtractions at CPU, power consumption for both the base voltage and the double-high voltage can be obtained.

FIG. 5 shows locations of the voltmeter and the ammeter installed for computing the base voltage of the positive and negative phases and the double-high voltage.

Figure 6:
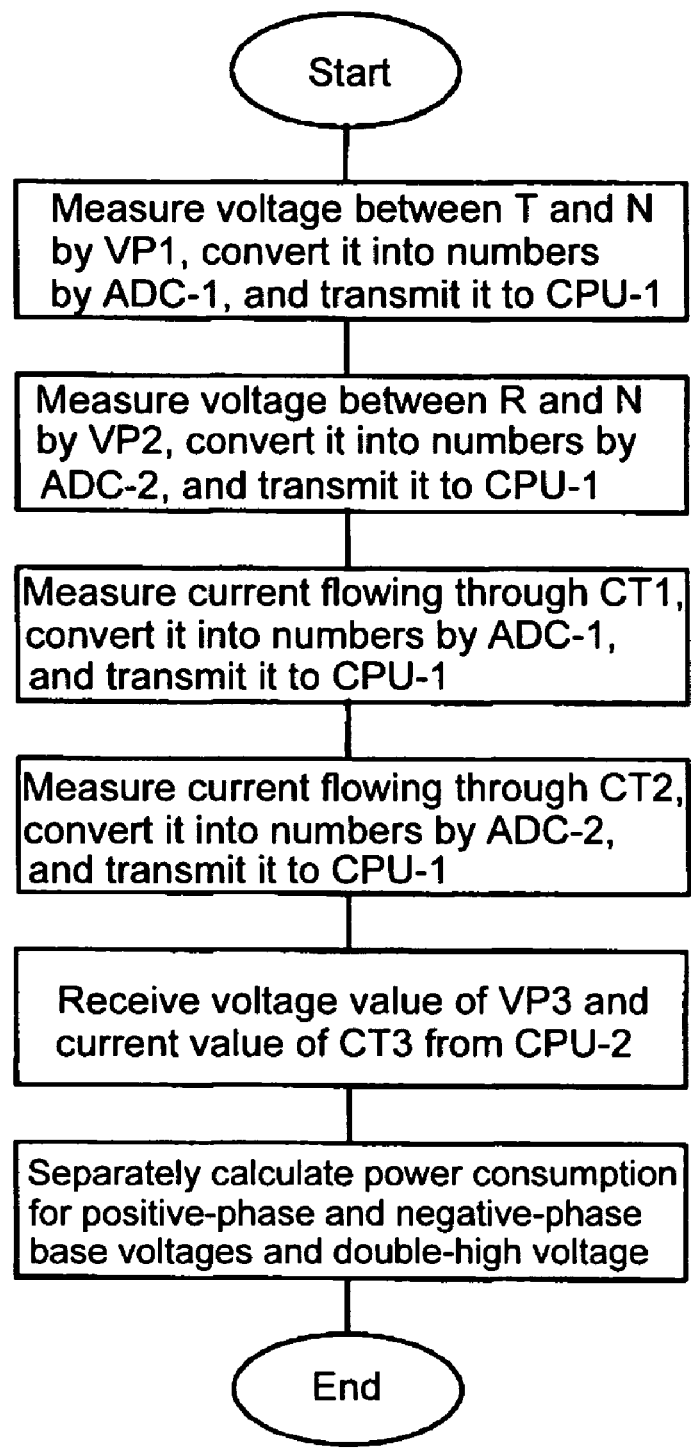
[FIG. 6] Flow of calculation of electrical power at CPU-1.
Figure 7:
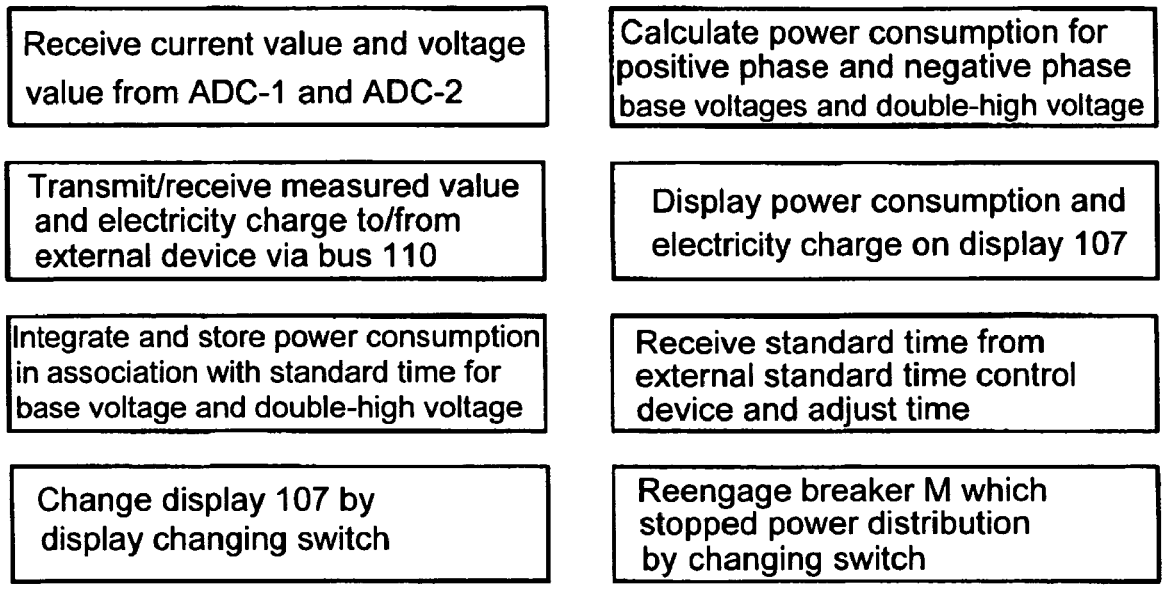
[FIG. 7] Functions of CPU-1.
Figure 8:
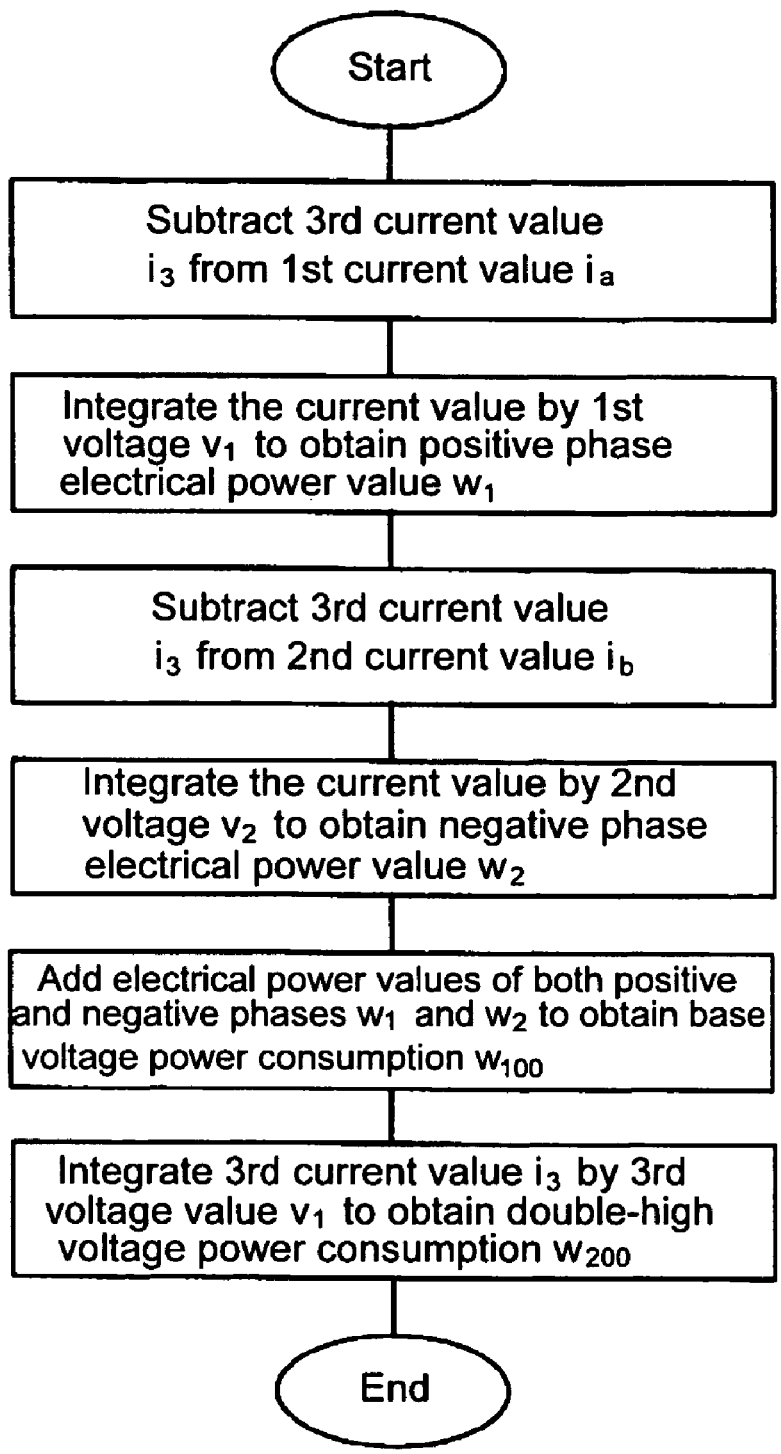
[FIG. 8] Flow of calculation of power consumption of base voltage and double-high voltage.
Figure 9:
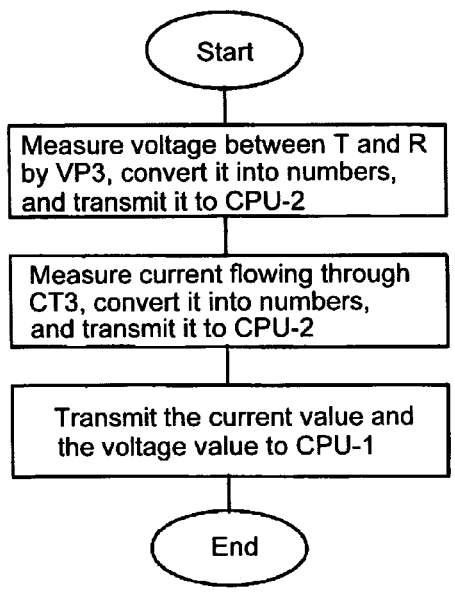
[FIG. 9] Flow of calculation of electrical power at CPU-2.
Figure 10:
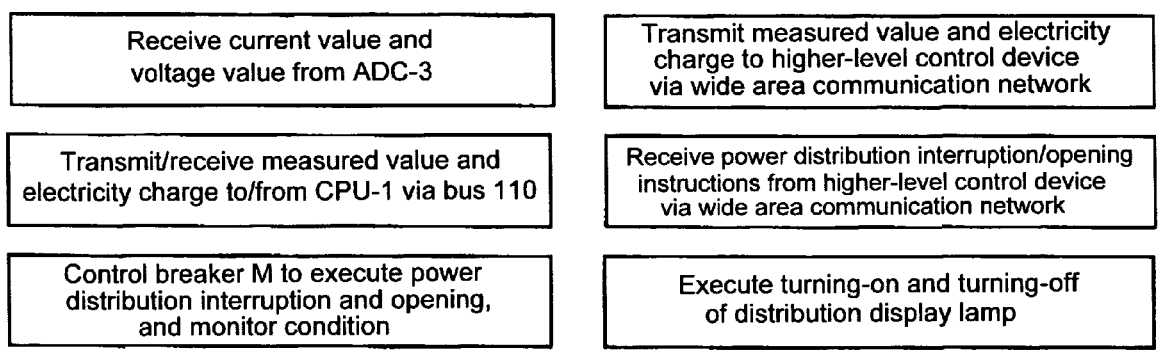
[FIG. 10] Functions of CPU-2.
Figure 11:
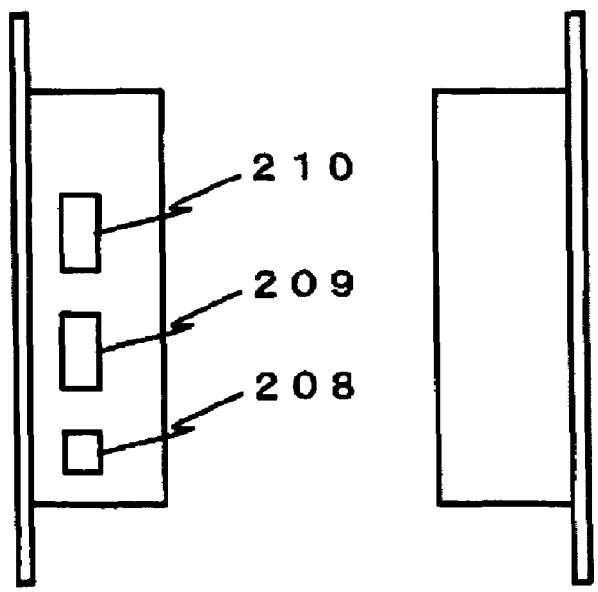
[FIG. 11] Side views of the watthour meter depicted in FIG. 1.
Figure 11:
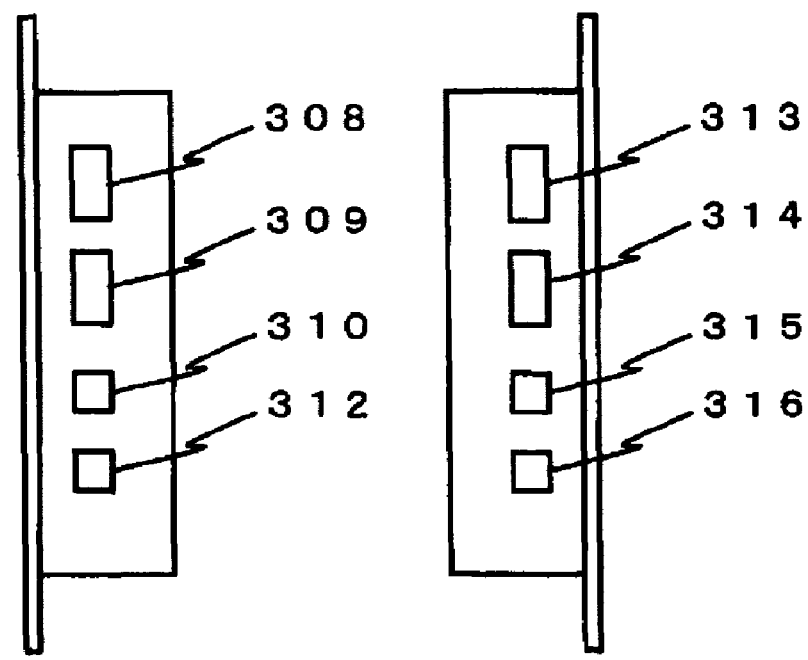

The arithmetic operation will be explained by using FIG. 6. The current (ia) of the T-phase measured by CT1 is the sum of the current (i1) for the first base voltage (positive phase) and the current (i3) for the double-high voltage (ia=i1+i3). The current (ib) of the R-phase measured by CT2 is the sum of the current (i2) for the second base voltage (negative phase) and the current (i3) for the double-high voltage (ib=i2+i3). By CT3, the current (i3) flowing through a load of the double-high voltage (in the present example, positive phase) is measured. Therefore, if the current (i3) measured by CT3 is subtracted from the current (ia) measured by CT1, then the current for the T-phase base voltage (i1=ia−i3) is obtained, and, similarly, if the current (i3) measured by CT3 is subtracted from the current (ib) measured by CT2, then the current for the R-phase base voltage (i2=ib−i3) is obtained. Then, by multiplying these currents by a corresponding voltage measured by VP1, VP2 and VP3, respectively, individual power consumption for the base voltages of the positive and negative phases, i.e., (ia−i3)·v1 and (ib−i3)·v2, respectively, and power consumption for the double-high voltage w200=i3·v3 can be obtained. Power consumption for the positive phase 100 V and the negative phase 100 V, power consumption for 200 V, total power consumption, etc. are sent from CPU-2 to CPU-1 and can be shown on the display panel 107. The roles of CPU-1 and CPU-2 are for the purpose of illustrating examples only and do not impose limitation. Furthermore, an additional CPU may be integrated therein, or all processes and calculations may be carried out by a single CPU.

Here, returning to FIG. 3, the letter M designates a motor for interrupting the supply of electrical power. It functions as a breaker in the cases where an overcurrent flows due to electrical leakage or a short circuit, a contract capacity is exceeded, power supply needs to be stopped because of non-payment of electricity charges, consumer's leaving the dwelling unit, etc., or power supply is stopped or restricted according to a service contract stipulating the aforementioned A- and B-categories of electricity charges, etc. It is possible to have a setting where the cold line opens last in the case of interlocked interruption and closes first when restarting. The letter L designates a limit switch which confirms the proper operation of the breaker function and detects the open/close status of the circuit. The motor and limit switches are just an illustration of functions employed in conventional watthour meters and do not limit the scope of the present invention.

Although, in the example of FIG. 3, the single voltage watthour meter section 152 for the base voltage or the double-high voltage only measures the current of the double-high voltage flowing through the T-phase 104 and the R-phase 106, it may measure the current of the base voltage flowing through the T-phase 104 and the N-phase 105 or the current of the base voltage flowing through the R-phase 106 and the N-phase 105. Locations for measuring the current and voltage and methods of calculating electrical power are for the purpose of illustrating examples only and do not limit the scope of the present invention.

Moreover, electrical power of the base voltage is supplied to electrical apparatuses used by the consumers from 117, 118 and 119, and, similarly, electrical power of the double-high voltage is supplied to the consumer from 120 and 121. 141, 142 and 143 are the display panels such as LEDs.

If the central processing unit section is equipped with a memory, then it can store data about power consumption for both the base voltage and the double-high voltage every 30 minutes and retain them for 35 or 65 days which were set in advance. The number of days and the time intervals are for the purpose of illustrating examples only and do not limit the scope of the present invention.

Furthermore, with built-in programs in the central processing unit section, it is possible to calculate electricity charges for the measured current based on separate rate structures for different voltages and different hours, stop power supply in the case of non-payment of electricity charges, stop power supply when the instantaneous current in the case of troubles such as electrical leakage exceeds a predetermined value, and conduct self-checks or periodical inspections.

Furthermore, a contract capacity can be altered. If electrical wiring was made with wires of a large capacity in advance, then an instantaneous watthour can be set by a command from the CPU. This makes it possible to eliminate the trouble of sending workers to the consumer's dwelling unit to change wiring every time a capacity is to be altered, thereby contributing to the saving of labor costs.

Furthermore, for both the base voltage and the double-high voltage, hour-specific charges for electricity consumed can be set individually. Built-in control and arithmetic operation programs were loaded in the CPU and its subsidiary memory devices, and, for example, for both the base voltage and the double-high voltage, the electricity charges are individually set at a low level for late hours (for example, from 23:00 hours to 05:00 hours), at a high level during peak hours of power consumption (for example, from 12:00 hours to 16:00 hours), and at an intermediate level for other hours. Although the number of hour categories in the example shown here are four (05:00 hours to 12:00 hours, 12:00 hours to 16:00 hours, 16:00 hours to 23:00 hours, and 23:00 hours to 05:00 hours), these are for the purpose of illustrating examples only and do not limit the scope of the present invention. It is possible to freely set the number of categories and the selection of hours through bidirectional communication from outside.

Similarly, setting for different seasons is also possible. The highest rate can be set for the summer (for example, from June to September). Furthermore, by combining the hours and seasons, it is also possible to set the highest rate for the peak hours (12:00 hours to 16:00 hours) of the summer (June to September). Rates for other seasons and hours can be set accordingly.

Furthermore, power consumption for different hours of different seasons can be stored in the CPU, and they can be displayed on the watthour meter or transmitted to an external measurement control device.

Furthermore, at the same time, it is possible to store power consumption every 30 minutes for every day of the year, record the highest value thereof (so called demand power) with the time it occurred, and send it out to the external measurement control device when necessary. This makes it possible to, for example, grasp accurately the peak value of the power consumption past noon in the middle of the summer or in the morning in the middle of the winter.

Hours and seasonal classifications settings shown here are for the purpose of illustrating examples only and do not limit the scope of the present invention.

Furthermore, the transmission of power consumption which has been mentioned in the present invention is conducted not by the number of pulses often observed in conventional watthour meters but by telegraphic messages made of numerical values. These telegraphic messages can be programmed to be automatically and periodically transmitted or can be transmitted according to the instructions from the higher-level control device 43. When power consumption are measured by pulses as in a conventional watthour meter, the watthour meter must always be connected to the higher-level control means. On the other hand, however, in the watthour meter of the present invention, since data are transmitted and uploaded intermittently by telegraphic messages, it does not have to be constantly connected to the Internet.

Furthermore, the watthour meters of the present invention are equipped with a built-in clock to manage hours and seasonal classifications. Furthermore, the clock can be set for the time and calendar by the instructions from external devices such as the measurement control device, and it is possible to synchronize the watthour meter with the calendar and standard time of external equipment.

Furthermore, as to the IP address to be assigned to each watthour meter, i.e., each dwelling unit, since global static addresses are expensive, the present invention makes it possible to assign inexpensive dynamic local address to the watthour meter each time it enters into communication. A control table is provided in the higher-level control means located at the external control center so that it can keep record of which watthour meter corresponds to which IP address. Moreover, then, the control table can be rewritten by a software program or via bidirectional communication so that, even if the IP address is changed, identification of which dwelling unit it refers to is possible.

In the present invention, by not directly sending data about power consumption of individual dwelling units to the measurement control device at the external control center but by intentionally providing a data accumulating means at the management room 23 in an apartment building having dwelling units or within an area, it is possible to measure and accumulate new data while retaining collected data even in an environment where a communication infrastructure fails to function because of a disaster such as an earthquake. Data for each dwelling unit collected every 30 minutes are retained for a period of, for example, two months or more. By driving the control means by an independent power source, it can collect and retain data within the consumer group 13 even if the wide area network 25 fails to function.

The invention claimed is:

1. A power consumption measuring device, which is provided at each consumer, which has a plurality of CPUs for measuring a base voltage and a double-high voltage of power supplied to each consumer through a single phase three-wire and for obtaining total power consumption of each consumer comprising clocking process for clocking a standard time;

data collection unit time setting process for setting a data collection unit time;

electrical power integration time setting process for setting an electrical power integration time;

first instantaneous electrical power value obtaining process for obtaining a first instantaneous electrical power value w1 consumed at the base voltage at an interval of the data collection unit time;

second instantaneous electrical power value obtaining process for obtaining a second instantaneous electrical power value w2 consumed at the base voltage at an interval of the data collection unit time;

base voltage instantaneous electrical power obtaining process for obtaining a base voltage instantaneous electrical power based on the first instantaneous electrical power value w1 and the second instantaneous electrical power value w2 obtained by the first instantaneous electrical power value obtaining process and the second instantaneous electrical power value obtaining process at an interval of the data collection unit time;

double-high voltage instantaneous electrical power obtaining process for obtaining a double-high voltage instantaneous electrical power at an interval of the data collection unit time;

base voltage watthour obtaining process for obtaining a base voltage watthour based on the base voltage instantaneous electrical power obtained by the base voltage instantaneous electrical power obtaining process and the data collection unit time;

first storing process for storing an added value cumulatively added the base voltage watthour obtained by the base voltage watthour obtaining process until the integration time as a base voltage power consumption for an integration time with a standard time and cumulatively added base voltage watthour data;

double-high voltage watthour obtaining process for obtaining a double-high voltage watthour based on the double-high voltage instantaneous electrical power and the data collection unit time;

second storing process for storing an added value cumulatively added the double-high voltage watthour obtained by the double-high voltage watthour obtaining process until the integration time as a double-high voltage power consumption for an integration time with a standard time and cumulatively added double-high voltage watthour data and watthour data storing term setting process for setting a watthour data storing term for more than predetermined days;

characterized by processing the above processes separately in the plurality of CPU.

2. The power consumption measuring device according to claim 1,
wherein two CPUs are provided,
wherein the clocking process, the data collection unit time setting process, the electrical power integration time setting process, the first instantaneous electrical power value obtaining process, the second instantaneous electrical power value obtaining process, the base voltage instantaneous electrical power obtaining process, the base voltage watthour obtaining process, the first storing process and the watthour data storing term setting process are conducted by one of the CPU; and the double-high voltage instantaneous electrical power obtaining process, the double-high voltage watthour obtaining process and the second storing process are conducted by the other of the CPU.

3. The power consumption measuring device according to claim 2, wherein hours are divided into plural;
electricity charge for each divided hours are set for the base voltage and the double-high voltage respectively;
and charge calculating process for calculating electricity charge for each hours corresponding to the base voltage and the double-high voltage is conducted by either one of the two CPUs.

4. The power consumption measuring device according to claim 3, wherein
electricity charges for each season are set for the base voltage and the double-high voltage respectively;
and charge calculating process for calculating electricity charge for each seasons corresponding to the base voltage and the double-high voltage is conducted by either one of the two CPUs.

5. The power consumption measuring device according to claim 3, wherein
electricity charges for each season are set for the base voltage and the double-high voltage respectively;
one of the two CPUs conduct charge calculating process for calculating electricity charge corresponding to the base voltage for each hours;
and the other CPU conduct charge calculating process for calculating electricity charge corresponding to the double-high voltage for each hours.

6. The power consumption measuring device according to claim 2, wherein
electricity charges for each season are set for the base voltage and the double-high voltage respectively;
and charge calculating process for calculating electricity charge for each seasons corresponding to the base voltage and the double-high voltage is conducted by either one of the two CPUs.

7. The power consumption measuring device according to claim 2, wherein hours are divided into plural;
electricity charge for each divided hours are set for the base voltage and the double-high voltage respectively;
first instantaneous electrical power value obtaining process for obtaining a first instantaneous electrical power value w1 consumed at the base voltage at an interval of the data collection unit time;
second instantaneous electrical power value obtaining process for obtaining a second instantaneous electrical power value w2 consumed at the base voltage at an interval of the data collection unit time;
base voltage instantaneous electrical power obtaining process for obtaining a base voltage instantaneous electrical power based on the first instantaneous electrical power value w1 and the second instantaneous electrical power value w2 obtained by the first instantaneous electrical power value obtaining process and the second instantaneous electrical power value obtaining process at an interval of the data collection unit time;
double-high voltage instantaneous electrical power obtaining process for obtaining a double-high voltage instantaneous electrical power at an interval of the data collection unit time;
base voltage watthour obtaining process for obtaining a base voltage watthour based on the base voltage instantaneous electrical power obtained by the base voltage instantaneous electrical power obtaining process and the data collection unit time;
first storing process for string an added value cumulatively added the base voltage watthour obtained by the base voltage watthour obtaining process until the integration time as a base voltage power consumption for an integration time with a standard time and cumulatively added base voltage watthour data;
double-high voltage watthour obtaining process for obtaining a double-high voltage watthour based on the double-high voltage instantaneous electrical power and the data collection unit time;
second storing process for storing an added value cumulatively added the double-high voltage watthour obtained by the double-high voltage watthour obtaining process until the integration time as a double-high voltage power consumption for an integration time with a standard time and cumulatively added double-high voltage watthour data and watthour data storing term setting process for setting a watthour data storing term for more than predetermined days;

characterized by processing the above processes separately in the plurality of CPU provided in each electric power consumption measuring device.

8. The power consumption measuring device according to claim 2, wherein electricity charges for each season are set for the base voltage and the double-high voltage respectively;

one of the two CPUs conduct charge calculating process for calculating electricity charge corresponding to the base voltage for each hours;

and the other CPU conduct charge calculating process for calculating electricity charge corresponding to the double-high voltage for each hours.

9. An electrical power control system, comprising a power consumption measuring device, which is provided at each consumer, which has a plurality of CPUs for measuring a base voltage and a double-high voltage of power supplied to each consumer through a single phase three-wire and for obtaining total power consumption of each consumer and higher-level control means provided at control point at a remote location, the electrical power control systems and the higher-level control means are connected by a network, the power consumption device comprising:

clocking process for clocking a standard time;

data collection unit time setting process for setting a data collection unit time;

electrical power integration time setting process for setting an electrical power integration time;

first instantaneous electrical power value obtaining process for obtaining a first instantaneous electrical power value w1 consumed at the base voltage at an interval of the data collection unit time;

second instantaneous electrical power value obtaining process for obtaining a second instantaneous electrical power value w2 consumed at the base voltage at an interval of the data collection unit time;

base voltage instantaneous electrical power obtaining process for obtaining a base voltage instantaneous electrical power based on the first instantaneous electrical power value w1 and the second instantaneous electrical power value w2 obtained by the first instantaneous electrical power value obtaining process and the second instantaneous electrical power value obtaining process at an interval of the data collection unit time;

double-high voltage instantaneous electrical power obtaining process for obtaining a double-high voltage instantaneous electrical power at an interval of the data collection unit time;

base voltage watthour obtaining process for obtaining a base voltage watthour based on the base voltage instantaneous electrical power obtained by the base voltage instantaneous electrical power obtaining process and the data collection unit time;

first storing process for string an added value cumulatively added the base voltage watthour obtained by the base voltage watthour obtaining process until the integration time as a base voltage power consumption for an integration time with a standard time and cumulatively added base voltage watthour data;

double-high voltage watthour obtaining process for obtaining a double-high voltage watthour based on the double-high voltage instantaneous electrical power and the data collection unit time;

second storing process for storing an added value cumulatively added the double-high voltage watthour obtained by the double-high voltage watthour obtaining process until the integration time as a double-high voltage power consumption for an integration time with a standard time and cumulatively added double-high voltage watthour data and watthour data storing term setting process for setting a watthour data storing term for more than predetermined days;

characterized by processing the above processes separately in the plurality of CPU provided in each electric power consumption measuring device.

10. The power control system according to claim 9, wherein two CPUs are provided in the electric power consumption measuring device, the clocking process, the data collection unit time setting process, the electrical power integration time setting process, the first instantaneous electrical power value obtaining process, the second instantaneous electrical power value obtaining process, the base voltage instantaneous electrical power obtaining process, the base voltage watthour obtaining process, the first storing process and the watthour data storing term setting process are conducted by one of the CPU;

and the double-high voltage instantaneous electrical power obtaining process, the double-high voltage watthour obtaining process and the second storing process are conducted by the other of the CPU.

11. The electrical power control system according to claim 10, wherein:

a sending process for sending telemessage to the higher level control means periodically is conducted by either one of two CPUs provided in each electrical power consumption measuring device.

12. The electrical power control system according to claim 11, wherein the telemessage sent to the higher level control means indicates first and second instantaneous current values ia, ib flowing in any of two different lines out of three lines comprising circuit for supplying the basic voltage, third instantaneous current value i3 flowing in circuit for supplying the double-high voltage or total power consumption, or the first through the third instantaneous current values ia, ib, i3 and the total power consumption.

13. The electrical power control system according to claim 10 wherein wiring for supplying electric power to consumer is made by large capacity beforehand, and setting process for setting contract capacity by downloading from the higher level control means is conducted by either one of the two CPUs.

* * * * *